(12) United States Patent
Lai et al.

(10) Patent No.: US 11,037,952 B2
(45) Date of Patent: Jun. 15, 2021

(54) PERIPHERAL CIRCUITRY UNDER ARRAY MEMORY DEVICE AND METHOD OF FABRICATING THEREOF

(71) Applicant: Taiwan Semiconductor Manufacturing Co., Ltd., Hsinchu (TW)

(72) Inventors: Sheng-Chih Lai, Hsinchu County (TW); Chung-Te Lin, Tainan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/457,223

(22) Filed: Jun. 28, 2019

(65) Prior Publication Data

US 2020/0105780 A1 Apr. 2, 2020

Related U.S. Application Data

(60) Provisional application No. 62/739,004, filed on Sep. 28, 2018.

(51) Int. Cl.
| | |
|---|---|
| *H01L 27/11573* | (2017.01) |
| *H01L 21/768* | (2006.01) |
| *H01L 27/11582* | (2017.01) |
| *H01L 21/311* | (2006.01) |
| *H01L 21/28* | (2006.01) |
| *H01L 29/51* | (2006.01) |

(Continued)

(52) U.S. Cl.
CPC ... *H01L 27/11573* (2013.01); *H01L 21/31111* (2013.01); *H01L 21/76834* (2013.01); *H01L 21/76877* (2013.01); *H01L 23/528* (2013.01); *H01L 23/5226* (2013.01); *H01L 23/53257* (2013.01); *H01L 27/11582* (2013.01); *H01L 29/40117* (2019.08); *H01L 29/513* (2013.01); *H01L 29/518* (2013.01)

(58) Field of Classification Search
CPC ......... H01L 27/11573; H01L 21/76877; H01L 27/11582; H01L 21/76834; H01L 21/31111; H01L 29/518; H01L 29/513; H01L 23/53257; H01L 23/5226; H01L 23/528; H01L 29/40117; H01L 29/792; H01L 27/11578; H01L 24/02; H01L 24/03; H01L 21/76897; H01L 2224/02331; H01L 2224/02381; H01L 2224/0231; H01L 2224/03
USPC .......................................................... 257/324
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |

(Continued)

*Primary Examiner* — Caleen O Sullivan
(74) *Attorney, Agent, or Firm* — Haynes and Boone, LLP

(57) ABSTRACT

A semiconductor device and method of forming thereof that includes a transistor of a peripheral circuit on a substrate. A first interconnect structure such as a first access line is formed over the transistor. A via extends above the first access line. A plurality of memory cell structures is formed over the interconnect structure and the via. A second interconnect structure, such as a second access line, is formed over the memory cell structure. The first access line is coupled to a first memory cell of the plurality of memory cell structures and second access line is coupled to a second memory cell of the plurality of memory cell structures.

20 Claims, 19 Drawing Sheets

(51) Int. Cl.
    *H01L 23/532*     (2006.01)
    *H01L 23/522*     (2006.01)
    *H01L 23/528*     (2006.01)

(56) References Cited

U.S. PATENT DOCUMENTS

| | | |
|---|---|---|
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 9,960,181 B1 * | 5/2018 | Cui .................. H01L 27/11548 |

* cited by examiner

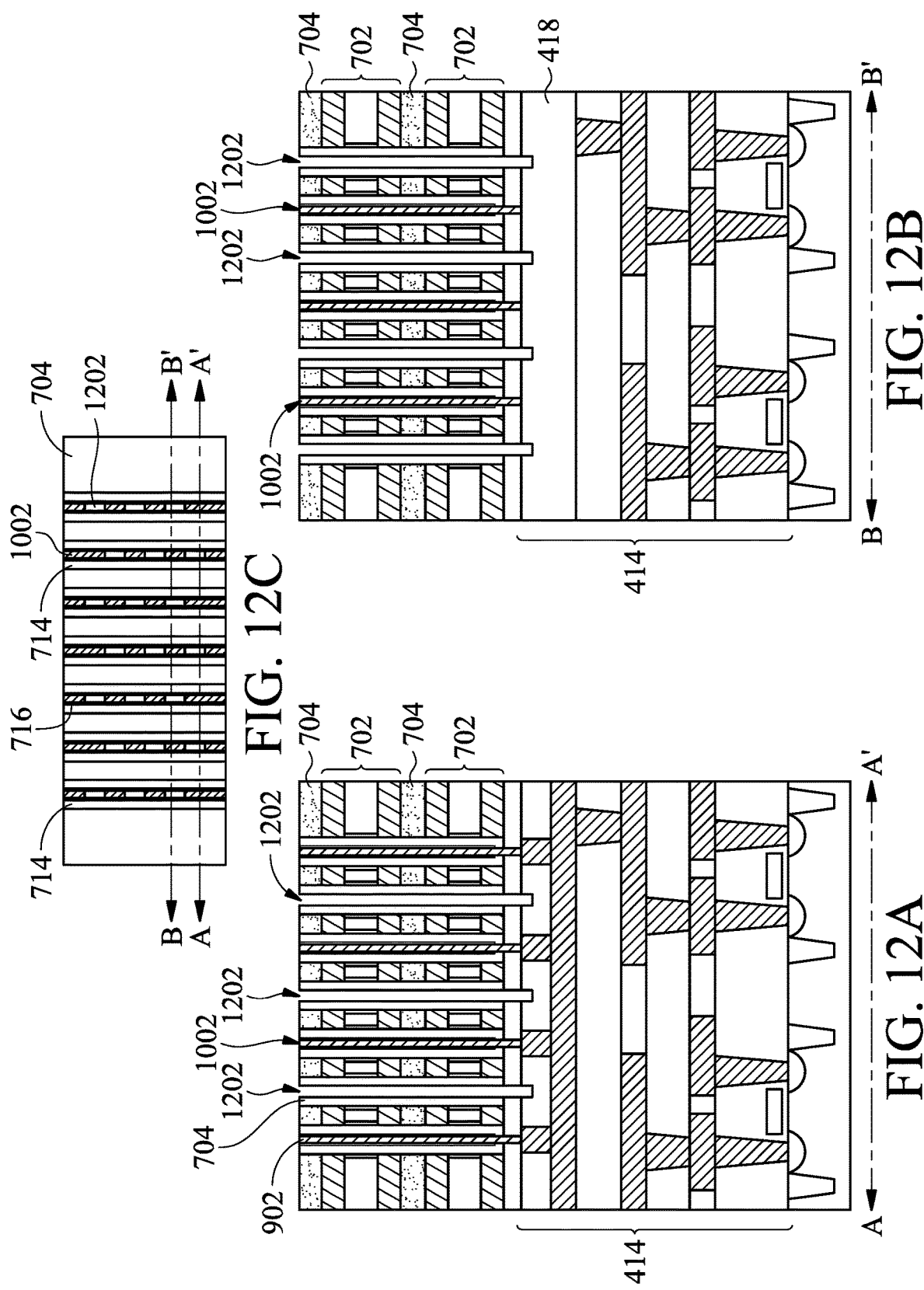

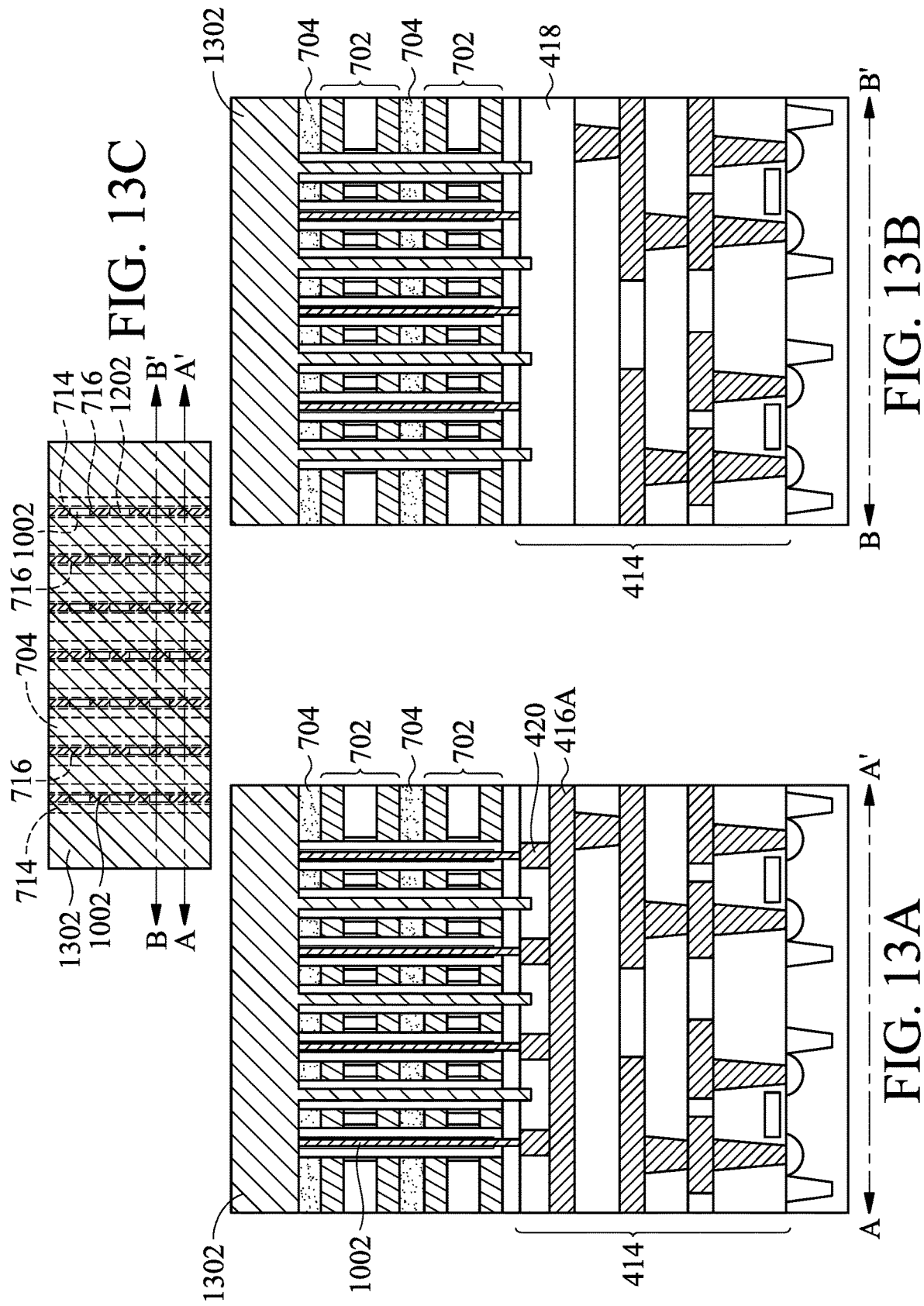

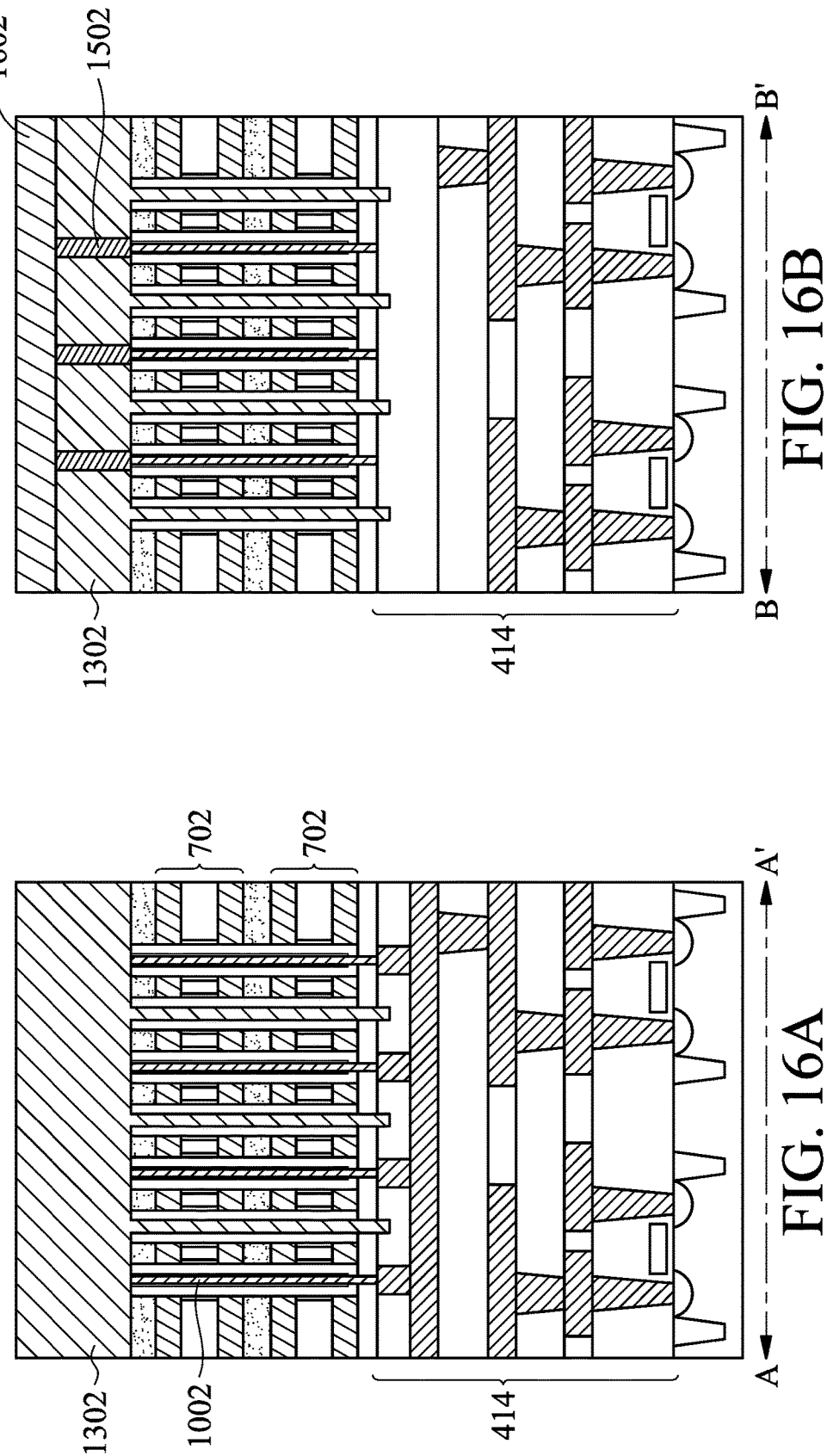
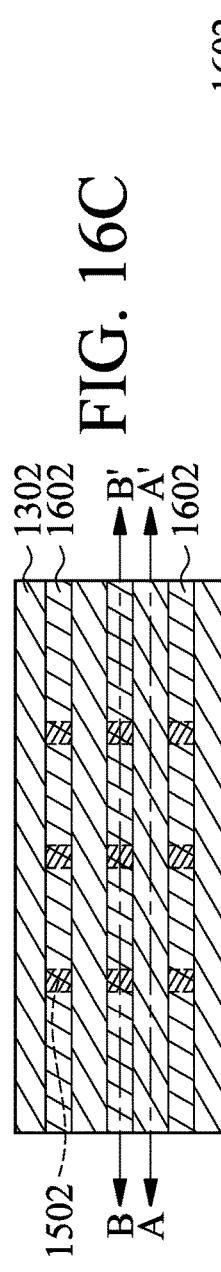
FIG. 16A    FIG. 16B    FIG. 16C

US 11,037,952 B2

PERIPHERAL CIRCUITRY UNDER ARRAY MEMORY DEVICE AND METHOD OF FABRICATING THEREOF

CROSS-REFERENCE TO RELATED APPLICATION

This application claims the benefit of U.S. Provisional Application No. 62/739,004, filed Sep. 28, 2018, hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

One type of device targeted for increased capacity and integration are memory devices. A reduction in memory device cell design has led to challenges in interconnect structure providing access and operation to these memory device cells. Further, the peripheral devices used to access these memory device cells have been targeted for improvements in integration.

Therefore, although conventional semiconductor devices have been generally adequate for their intended purposes, they are not satisfactory in every respect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4, 5A, 6A, 7A, 8A, 9A, 10A, 11A, 12A, 12B, 13A, 13B, 14A, 14B, 15A, 15B, 16A, and 16B are cross-sectional views of an embodiment of a semiconductor memory device fabricated according to one or more steps of the method of FIG. 3; and FIGS. 5B, 6B, 7B, 11B, 12C, 13C, 14C, 15C, and 16C are corresponding top views of an embodiment of a semiconductor device corresponding to the semiconductor memory device fabricated according to one or more steps of the method of FIG. 3.

DETAILED DESCRIPTION

Figure 1:
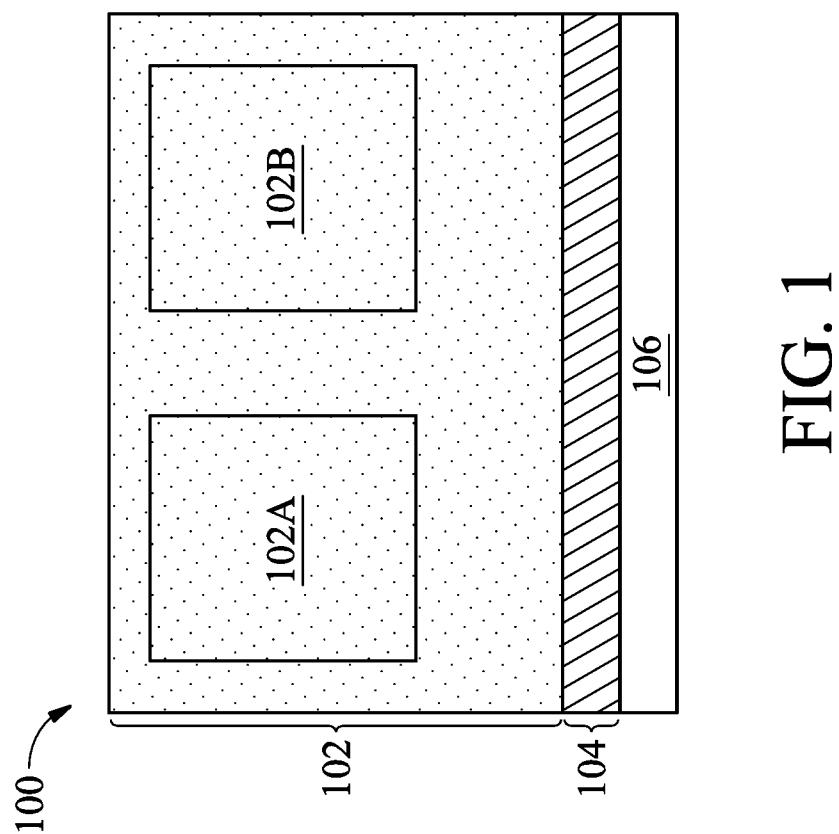
FIG. 1 is a diagrammatic illustration of a semiconductor device including an array of memory cells according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Referring now to FIG. 1, illustrated is a diagrammatic view of a semiconductor device 100. The semiconductor device 100 is a semiconductor memory device as it includes a plurality of memory cells operable to perform as storage devices. The semiconductor device 100 includes a memory cell array region 102, associated peripheral circuit region 104, each of which are formed on a substrate 106.

The peripheral circuit region 104 may include components (e.g., semiconductor devices) for driving the devices of the memory cell array region 102. The peripheral circuit region 104 may include various devices operable to access and/or control the memory cell array region (e.g., to perform read/write/erase operations). The devices include n-type FET devices and p-FET devices. The devices may be configured as planar transistors or multi-gate transistors such as fin-type multi-gate transistors referred to herein as FinFET devices. Such a FinFET device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may also be applied in the peripheral circuitry region including for example gate-all-around (GAA) devices, Omega-gate (Ω-gate) devices, or Pi-gate (H-gate) devices.

The memory cell array region 102 includes a plurality of arrays of memory cells, which are illustrated for reference as array 102A and array 102B. Each of the memory arrays may include a plurality of memory cells operable for storage, the cells of an array may be arranged in a row/column configuration. In an embodiment, the memory cells are flash memory cells. In a further embodiment, the memory cells are NOR type flash memory cells. In some embodiments, the memory cell arrays 102A and/or 102B include stackable memory cells, vertically arranged in an array format. While flash memory cells are provided as an exemplary device herein, other types of devices may also benefit from the disclosure including, for example EEPROM cells. In an embodiment, input-output pads (not shown) are disposed on an upper surface of the semiconductor device 100 (e.g., opposed to substrate 106).

In some embodiments, the semiconductor device 100 may be referred to as a peripheral circuit under memory array (PUA) device. The PUA device configuration may provide an increase in memory density. For example, the increase may be evident in comparison to a configuration positioning a peripheral circuit adjacent (e.g., side-by-side) with the memory cell arrays. In contrast to the "side-by-side" configuration, the PUA device allows the memory cells to be formed at least partially vertically above the peripheral circuitry. Thus, as illustrated in FIG. 1, the memory cell array region 102 is disposed above the peripheral circuit region 104. For example, the peripheral circuit 104 interposes the memory cell array region 102 and the substrate 106.

Figure 2:
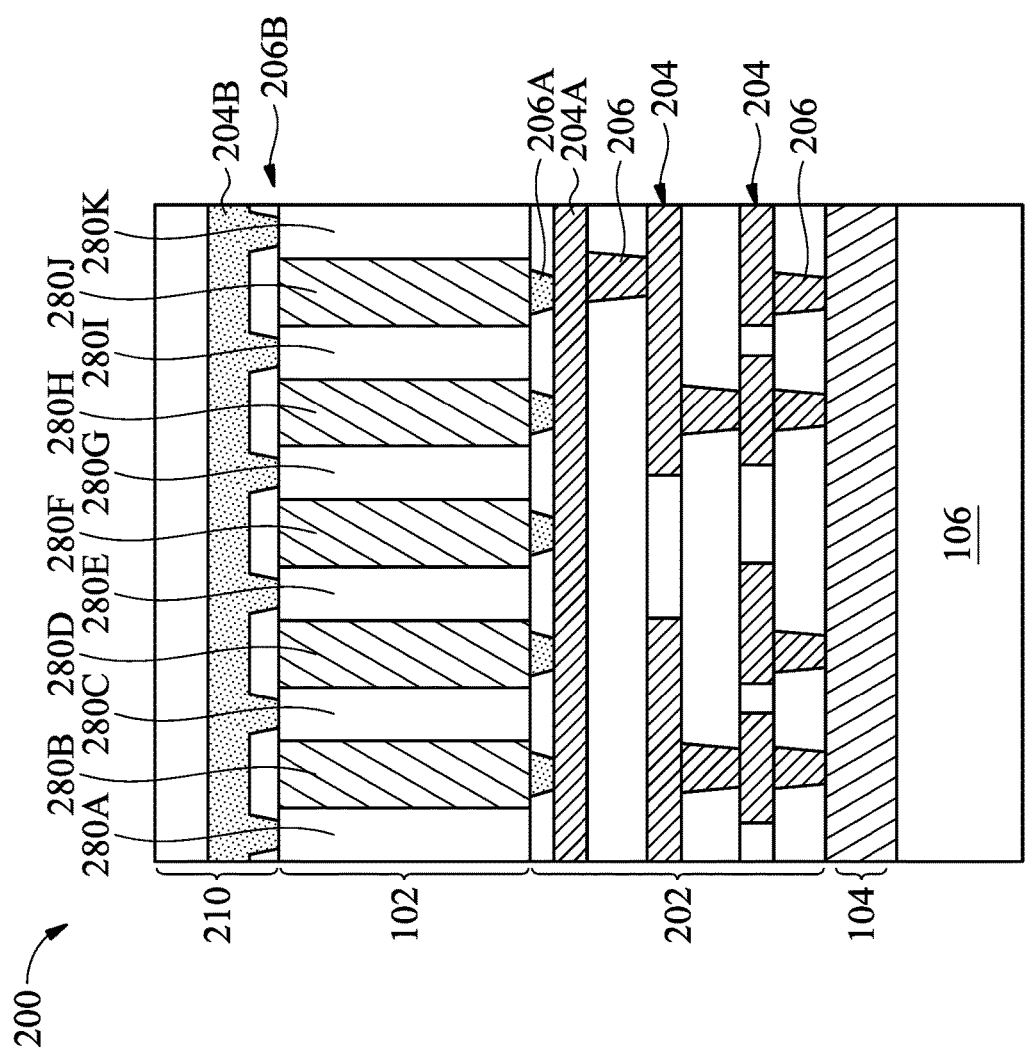
FIG. 2 is a cross-sectional illustration of an embodiment of a semiconductor device illustrating an interconnection from a peripheral circuit to the memory cells of the array according to one or more aspects of the present disclosure.

The design and implementation of the interconnection between the memory cell array region 102 and the peripheral circuit region 104 in a peripheral circuit under array configuration however can be challenging. For example, the conductive line/via routing between the memory cell array region 102 and the peripheral circuit region 104 must be addressed. FIG. 2 provides an illustration of such a routing design.

Referring to FIG. 2, illustrated is a device 200 that, similar to as discussed above with reference to the device 100 in FIG. 1 includes a peripheral circuit region 104 and an overlying memory cell array region 102. The device 200 is a PUA device. The device 200 further illustrates a first, or lower, interconnect region 202. The lower interconnect region 202 may be a multi-layer interconnect (MLI) used to connect the devices of the peripheral circuit region 104 with one another. The MLI of the lower interconnect region 202 may also be used to connect the devices of the peripheral circuit region 104 with devices (e.g., cells and components thereof) of the memory cell array region 102. The MLI of the interconnect region 202 includes a plurality of metal lines (e.g., providing horizontal routing) 204 interconnected by a plurality of contacts or vias (e.g., providing vertical routing) 206. The metal lines 204 and vias 206 may be surrounded with dielectric material 208 such as inter layer dielectric (ILD layers), etch stop layers (ESL), and the like.

The metal lines 204 and the vias 206 may include conductive material such as tungsten (W), molybdenum (Mo), titanium (Ti), cobalt (Co), tantalum (Ta), nickel (Ni), polysilicon, aluminum (Al), copper (Cu), silicides, nitrides, and/or other suitable conductive materials arranged in one or more layers. The dielectric materials 208 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials including those typically used for ILD layers. The dielectric materials 208 may also include a silicon nitride layer, silicon oxide layer, a silicon oxynitride layer, and/or other suitable dielectric materials including those typically used for ESLs. The dielectric materials may be deposited by a PECVD process or other suitable deposition technique.

Specifically illustrated in the lower interconnect region 202 is a metal line 204A, which may be an uppermost or top metal line of the MLI. In an embodiment, the metal line 204A is a conductive line operable to access memory cells of the memory cell array region 102. Thus, the metal line 204A may be referred to herein as an "access line." The metal line 204A is an access line providing electrical connection to one or more memory cells in the memory cell array region 102. Exemplary memory cells of the memory cell array region 102 are discussed below. In an embodiment, the metal line 204A is an access line providing a word line (WL) for accessing memory cells of the array region 102. In an embodiment, the metal line 204A is an access line providing a bit line (BL) for accessing memory cells of the array region 102.

As illustrated in the device 200, the memory cell array region 102 includes a plurality of memory cells or storage cells, which are labeled 208A-208K for ease of reference. The memory cells 208A-208K are illustrative of a plurality of memory cells arranged in a row/column configuration that in some embodiments together operate as a single memory array (e.g., 102A of FIG. 1) in the memory cell array region 102. The memory cells 208A-208K may be one or more of various types of memory cells including those that form FLASH memory devices (e.g., NAND or NOR type), SRAM memory devices, DRAM memory devices, and/or other suitable memory types. It is noted that each of the illustrated "cells" 208A-208K may be a vertically configured stack of multiple memory cells. For example, the illustrated memory cell 208A may be illustrative of a stack of multiple memory cells each sharing, for example, a gate line that is connected to the access line 204A.

The access line—metal line 204A—may be interconnected to a first grouping of the memory cells, as illustrated by the interconnection of the metal line 204A with each of cells 208B, 208D, 208F, 208H, or 208J by way of the vias 206A. FIG. 2 illustrates a single metal line 204A interconnected to each of cells 208B, 208D, 208F, 208H, or 208J through a respective via 206A. However, it is understood that there may be a plurality of metal lines, including those substantially planar with the metal layer 204A (e.g., at the same metallization level as metal layer 204A), that are interconnected to memory cells 208B, 208D, 208F, 208H, or 208J or other cells of the array to provide the access line functionality similar to that of the metal layer 204A. For example, a top view of the device 400 is illustrated below and would apply to that of the device 200. In some embodiments, the metal line 204A, or a line coplanar therewith, is interconnected to every other vertically extending column of memory cells of the memory cell array.

Above the memory cell array region 102 are additional interconnect features of a top interconnect region 210. The top interconnect region 210 may be formed above the memory cells 208A-208J, in other words, further from the substrate 106. In an embodiment, the top interconnect region 210 includes a metal line 204B that is interconnected to a second set or portion of the memory cells, as illustrated by the interconnection to cells 208A, 208C, 208E, 208G, 208I, and 208K. The metal line 204B may be interconnected to each of cells 208A, 208C, 208E, 208G, 208I, and 208K through a respective via 206B. Again, a single metal line 204B is illustrated in the cross-sectional view of FIG. 2 as interconnected to each of cells 208A, 208C, 208E, 208G, 208I, and 208K through a respective via 206B. However, it is understood that there may be a plurality of metal lines, such as those substantially planar with the metal layer 204B, that are interconnected to memory cells 208A, 208C, 208E, 208G, 208I, and 208K or other cells of the array to provide the access line functionality similar to that of the metal layer 204B. For example, top views of the device 400 is illustrated below and would apply to that of the device 200. In some embodiments, the metal line 204B is interconnected to every other vertically extending column of memory cells of the memory cell array. For example, the illustrated memory cell 208B may be illustrative of a stack of multiple memory cells each sharing, for example, a gate line that is connected to the access line 204B. The top interconnect region 210 may also include a plurality of additional metal lines, vias, input-output (I/O) pads, etc. (not shown) that may be also interposed by dielectric material. The dielectric material of the top interconnect region 210 may be substantially similar to the dielectric materials of the interconnect region 202.

In an embodiment, the metal line 204B has a same function as the metal line 204A, merely providing the functionality to a second set rather than first set of the memory cells 208. In an embodiment, the metal line 204B is an access line providing a word line (WL). In an embodiment, the metal line 204B is an access line providing a bit line (BL) to the cell. That is, in some embodiments, the gate pick-up of the devices of the memory array are performed either by interconnection to one of the metal line 204B or the metal line 204A.

The routing illustrated in FIG. 2 may be advantageous in that it can avoid having all interconnection of the access lines (e.g., gate pick-ups) through a top of the memory array (e.g., towards to the I/O pads), which would degrade memory cell scalability. That is, the pitch required for interconnection of the access lines (e.g., gate pick-ups) in the device 200 is defined by half of the interconnections with the memory cells (e.g., gate pick-ups) of the array being done at top region and the other half of the interconnections with the memory cells (e.g., gate pick-ups) being done at a bottom region of the array allows for improved scalability of the array. Additionally, the device of FIG. 2 may be fabricated in a manner such that it avoids the need for very high-aspect ratio, non-self-aligned etching to open up connections to a bottom interconnection for example, by the implementation of one or more steps of the method 300 of FIG. 3. For example, certain embodiments of the method 300 provide for vias (e.g., 206A) providing an interconnect to the bottom access lines to be formed prior to the memory cell array region 102.

The interconnection region 202 or portions thereof between the peripheral circuit region 104 and the memory cell array region 102 may be referred to as an interposer. The interposer may include all or portions of, for example, the MLI of the interconnect region 202 such as vias 206A and/or the metal line 204A. Thus, various aspects of the present disclosure provide an interposer formation method before the memory array process to provide benefits, in some embodiments, one or more of (1) simplifying process integration flow, (2) relaxing interconnect (e.g., metal) pitch requirements, and/or (3) improving memory performance. In an embodiment, the devices and methods provided herein may improve bandwidth (BW) for memory devices such as 3D flash memory.

Figure 3:
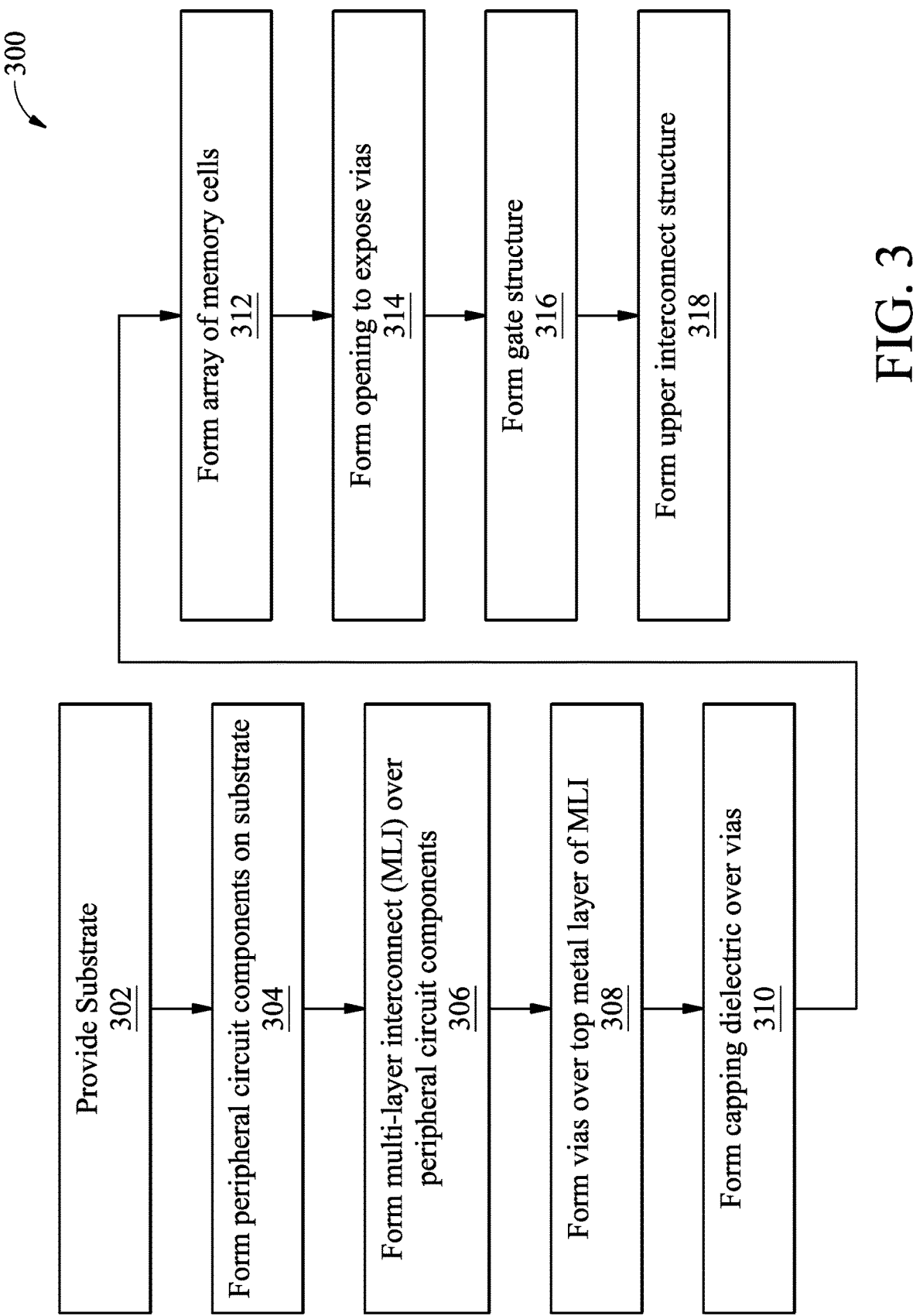
FIG. 3 is a flow chart illustrating an embodiment of a method of fabricating a semiconductor device according to one or more aspects of the present disclosure.

Referring now to FIG. 3, illustrated is a method 300 that provides for fabricating a semiconductor memory device having a peripheral circuitry region underlying a memory cell array region according to one or more aspects of the present disclosure. The method 300 may be used to fabricate the device 100 or the device 200, as discussed above with reference to FIGS. 1 and 2 respectively. FIGS. 4, 5, 6A, 7A, 8, 9, 10, 11A, 12A, 12B, 13A, 13B, 14A, 14B, 15A, 15B, 16A, and 16B provide cross-sectional views of an embodiment of a device 400 corresponding to one more steps of the method 300 of FIG. 3. FIGS. 5B, 6B, 7B, 11B, 12C, 13C, 14C, 15C, and 16C provide top views of an embodiment of the device 400 corresponding to one more steps of the method 300 of FIG. 3. It is noted that the device 400 is exemplary with respect to, for example, the configuration of memory cells and the type of memory cells, and the method 300 may equally apply to other embodiments including other memory cell types. The device 400 provides a flash memory device and in particular, vertically stacked flash memory devices. However, other device types may also benefit from the present disclosure.

Figure 4:
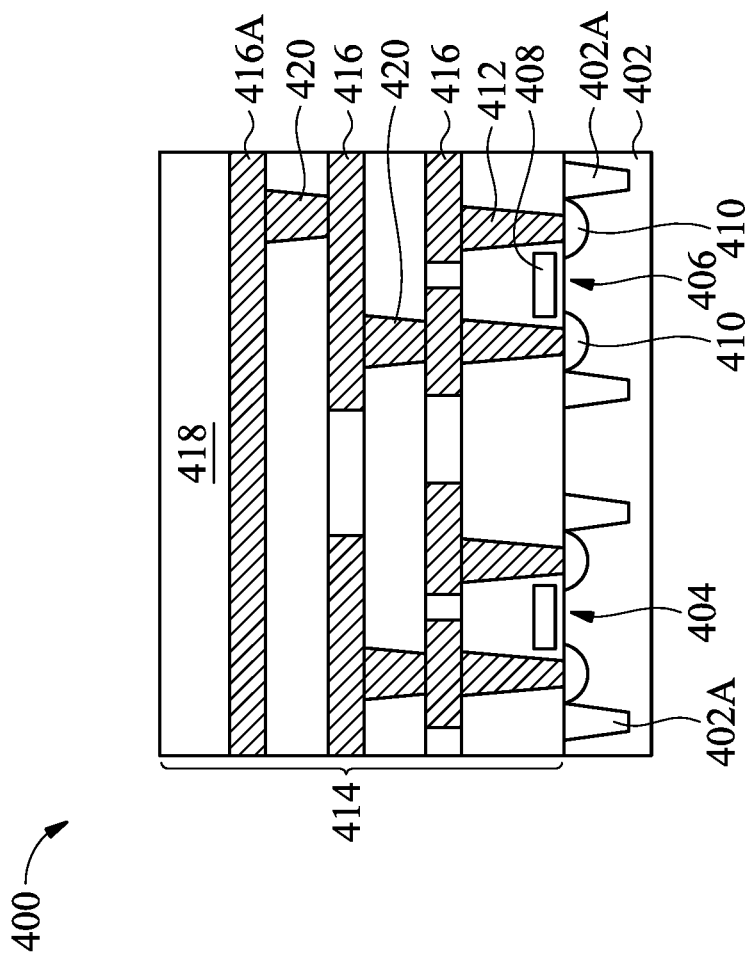

The method 300 begins at block 302 where a substrate is provided. Referring to the example of FIG. 4, a substrate 402 is provided. The substrate 402 may be substantially similar to the substrate 106 discussed above. In some embodiments, the substrate 402 may be a semiconductor substrate such as a silicon substrate. The substrate 402 may include various layers, including conductive or insulating layers formed on a semiconductor substrate. The substrate 402 may include various doping configurations depending on design requirements as is known in the art. For example, different doping profiles (e.g., N wells, P wells) may be formed on the substrate 402 in regions designed for different device types. The different doping profiles may include ion implantation of dopants and/or diffusion processes. The substrate 402 typically has isolation features (e.g., shallow trench isolation (STI) features) including those isolation features interposing the regions providing different device types. STI features 402A are illustrated in FIG. 4. The substrate 402 may additionally or alternatively (e.g., to the silicon discussed above) include other semiconductors such as germanium, silicon carbide (SiC), silicon germanium (SiGe), or diamond. Alternatively, the substrate 402 may include a compound semiconductor and/or an alloy semiconductor. Further, the substrate 402 may optionally include an epitaxial layer (epi-layer), may be strained for performance enhancement, may include a silicon-on-insulator (SOI) structure, and/or have other suitable enhancement features.

The method 300 then proceeds to block 304 where peripheral circuits components are formed on the substrate. The formation of the peripheral circuits may include devices making up a control circuit for operating an array of memory cells such as an array of NAND-type memory cells as discussed below including peripheral circuitry such as devices for assisting read/write/erase functionality of the memory cells including but not limited to voltage boost circuitry, page buffer circuitry, column decoder, row decoder, error correction circuitry, write assist circuitry, interface circuitry including for interfacing between types of memory cells, bus control circuitry, and the like. The peripheral circuits may be formed of MOS transistors. The MOS transistors may be p-type MOS transistors (PMOS) or n-type MOS transistors (NMOS). The MOS transistors may be planar type transistors, fin-type transistors (e.g., FinFETs), and/or other transistor configurations including as discussed above.

Referring to the example of FIG. 4, a first peripheral device 404 and a second peripheral device 406 are formed on the substrate 402. In an embodiment, the first peripheral device 404 is one of an NMOS transistor or PMOS transistor and the second peripheral device 406 is the other one of an NMOS transistor or PMOS transistor. While only two peripheral devices are illustrated, it is understood that typically hundreds, thousands, or many more devices may be used to form the peripheral circuit. Each peripheral device 404 and 406 includes a gate structure 408 interposing source/drain regions 410.

The gate structures 408 may include a gate dielectric layer and overlying gate electrode layer. In some embodiments, the gate dielectric layer(s) include an interfacial layer of dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. In some embodiments, the gate dielectric layer(s) include high-K gate dielectric layer of high-K dielectric materials such as hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods. The gate electrode layer(s) may include polysilicon, a metal, metal alloy, or metal silicide and overlie the gate dielectric layer(s). The gate electrode layer(s) may include a single layer or alternatively a multi-layer structure, such as various combinations of a metal layer with a selected work function to enhance the device performance (work function metal layer), a liner layer, a wetting layer, an adhesion layer, a fill layer, and/or other suitable layers. By way of example, compositions that may be present in the gate electrode layer(s) include polysilicon, Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer(s) may be formed by ALD, PVD, CVD, e-beam evaporation, or other suitable process. Further, the gate structures may be formed separately for N-FET and P-FET transistors which may use different gate electrode layers.

The source/drain regions 410 may be regions of the substrate 402 suitably doped to provide the functionality of the associated device or may be epitaxially grown features on the substrate 402 that are likewise suitably doped for the given device type (e.g., n-type or p-type).

The method 300 then proceeds to block 304 where a multi-layer interconnect (MLI) is formed over and coupled to the peripheral circuit components. The multi-layer interconnect can serve to interconnect devices of the peripheral circuit, as well as interconnect the peripheral circuit with an overlying memory array. As such, portions of the MLI may be referred to as providing an interposer. The multi-layer interconnect of block 304 may be substantially similar to as discussed above with respect to bottom interconnect region 202.

Referring to the example of FIG. 4, a multi-layer interconnect 414 (MLI 414) is formed over the substrate 402. Contact structures 412 are shown to the source/drain regions 410 of each of the first and second peripheral devices 404 and 406. It is noted however, other contacts may be formed to the gate structures 408 (not shown). The contact structures 412 may include suitable materials such as tungsten, silicide, and/or other conductive materials. The contact structures 412 may have a multi-layer structure including, for example, liner layers, seed layers, adhesion layers, barrier layers, and the like.

The MLI 414 formed over the first peripheral device 404 and the second peripheral device 406 also includes a plurality of metal layers 416 and vias 420. (It is noted that the metal layers 416 and vias 420 are exemplary only and any number of layers and configuration of lines therein may be provided.) The MLI 414 may be substantially similar to the interconnect region 202, discussed above with reference to FIG. 2. The MLI 414 may interconnect the first peripheral device 404 and the second peripheral device 406. The MLI 414 also may interconnect one or more of the first peripheral device 404 and the second peripheral device 406 with an overlying memory cell(s), as discussed below.

The metal layers 416 and vias 420 may include suitable conductive materials such as polysilicon, copper, tungsten, silicide, aluminum, titanium (Ti), cobalt (Co), molybdenum (Mo), tantalum (Ta), nickel (Ni), silicides of these materials, nitrides of these materials, and/or other suitable conductive materials. The metal layers 416 and vias 420 may include a multi-layer structure including, for example, liner layers, seed layers, adhesion layers, barrier layers, and the like.

In some embodiments, the block 306 includes forming a top metal layer of the MLI. The top metal layer may provide metal lines that provide a horizontal routing for a signal or signals produced by the circuits of the peripheral devices. In the embodiment of FIG. 4, the top metal layer 416A provides metal lines that give a horizontal routing for a signal such as from peripheral devices 404, 406. In an embodiment, the top metal layer 416A may provide an access line for one or more cells of the memory cell array. In an embodiment, the access line, routed on metal layer 416A, provides one or more word lines (WL) for accessing a memory cell array (discussed below). In an embodiment, the access line, routed on metal layer 416A, and provides one or more bit lines (BL) for accessing a memory cell array (discussed below). It is noted that whether the access line routed on metal layer 416A is a word line or a bit line is dependent on the desired configuration of the cells, where the functionality of the other one of the word line or bit line is provided, for example, within the stacks 702 of the memory device (e.g., by horizontal routing of conductive layers (e.g., metal, poly, conductively doped regions 706, etc.). As illustrated by the top view of FIG. 5B, the top metal layer 416A may include a plurality of horizontally extending metal lines each spaced at a pitch Y from one another.

In some embodiments, a dielectric layer is formed over the top metal layer. The dielectric layer may be an interlayer dielectric layer (ILD). Referring to the example of FIG. 4, an ILD layer 418 is formed over the top metal layer 416A. The ILD layer 418 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric materials may be deposited by a PECVD process or other suitable deposition technique. In some embodiments, the ILD layer 418 also includes an etch stop layer, for example formed above or interfacing the metal layer 416A. The etch stop material may include a silicon nitride layer, silicon oxide layer, a silicon oxynitride layer. and/or other suitable dielectric materials.

The method of claim 300 then proceeds to block 308 where conductive vias are formed above and connected to the top metal layer. The vias may be formed to each metal line of the top metal layer. The vias may be filled with suitable conductive materials such as tungsten. In an embodiment, the vias are formed by patterning the dielectric material overlying the top metal line. In some embodiments, the patterning includes a photolithography process that provides for forming a photoresist layer (resist) overlying the dielectric layer, exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the dielectric while an etch process forms recesses into the dielectric layer according to the pattern of vias to be formed, thereby leaving openings in the dielectric layer. The recesses may be etched using a dry etch (e.g., chemical oxide removal), a wet etch, and/or other suitable processes. The recesses may then be filled with conductive material to form the vias. In some embodiments, a chemical mechanical planarization (CMP) process is performed after deposition of the conductive material to provide a top surface of the vias substantially planar with a top surface of the dielectric layer.

Figure 5A:
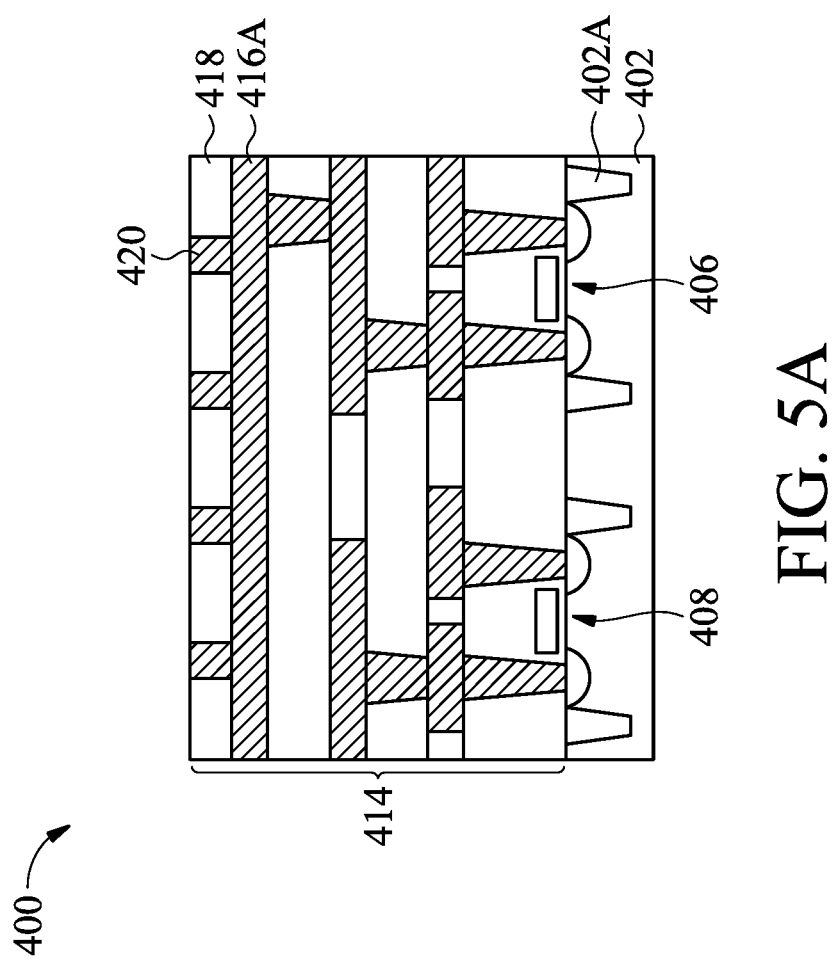
Figure 5B:
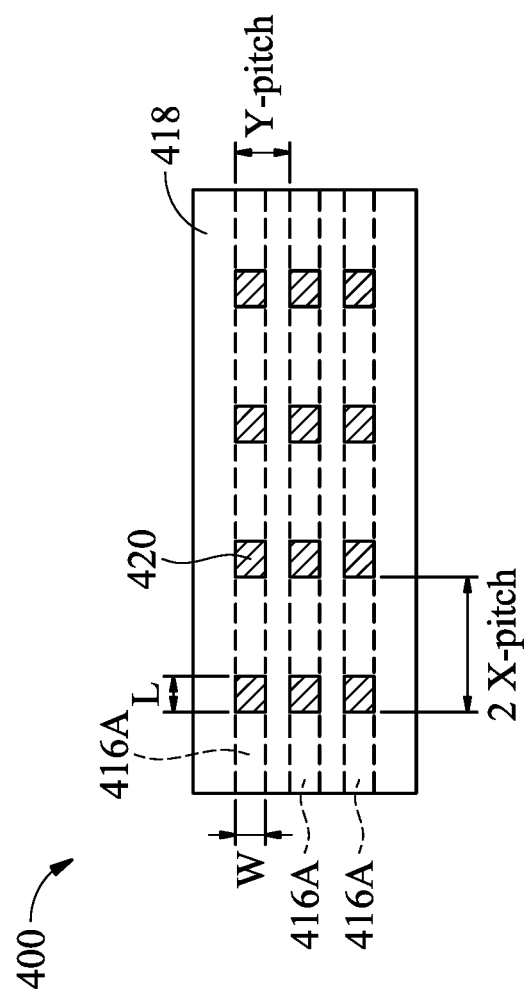

Referring to the example of FIGS. 5A and 5B, vias 420 are formed extending through the ILD layer 418 to the metal layer 416A. As illustrated by the top view of FIG. 5B, the vias 420 are aligned over each metal line of the top metal layer 416A. In an embodiment, memory cells of the device 400 have a Y-pitch between access lines of neighboring cells and an X-pitch between access lines of neighboring cells. In an embodiment, the Y-pitch is defined by the WL pitch between cells. In an embodiment, the X-pitch is defined by the BL pitch between cells. As illustrated in FIG. 5B the vias 420 are configured as having a Y-pitch and 2*X-pitch (or being disposed at every other BL).

In an embodiment, the vias 420 have a dimension L in the x-axis direction and a dimension w in the y-axis direction. The dimension L and the dimension w may be substantially similar. In an embodiment, the dimension L is 0.2 to 0.8 the pitch of bit lines associated with the memory cell array (X-pitch) disposed above the vias 420 (and discussed below). In an embodiment, the vias 420 have a dimension w of 0.2 to 0.8 the pitch of the word lines (WL) associated with the memory cell array (Y-pitch) disposed above the vias 420. For example, the vias 420 may have a dimension in the y-axis direction of 0.2 to 0.8 the pitch of the lines of the metal layer 416A illustrated in FIG. 5B. The pitch of the vias 420 may be substantially equal to the Y-pitch—e.g., WL pitch of the memory cell array disposed above the vias 420. The pitch of the vias 420 in the x-direction is 2 times the X-pitch—e.g., twice the BL pitch of the memory cell array disposed above the vias 420. This relaxed pitch in the x-direction is due to the configuration of half of the cells being configured to connect to the access line (e.g., WL) of the top metal layer 416A (e.g., bottom WL) and half of the cells being configured to connect to the metal layer 1602 (discussed below).

Figure 6A:
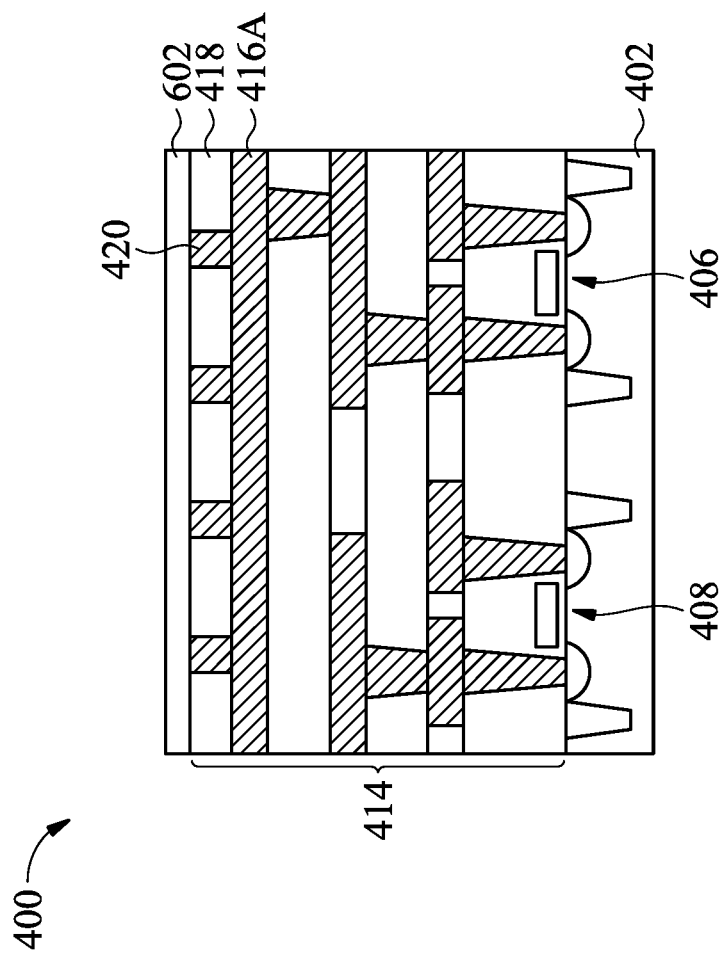
Figure 6B:
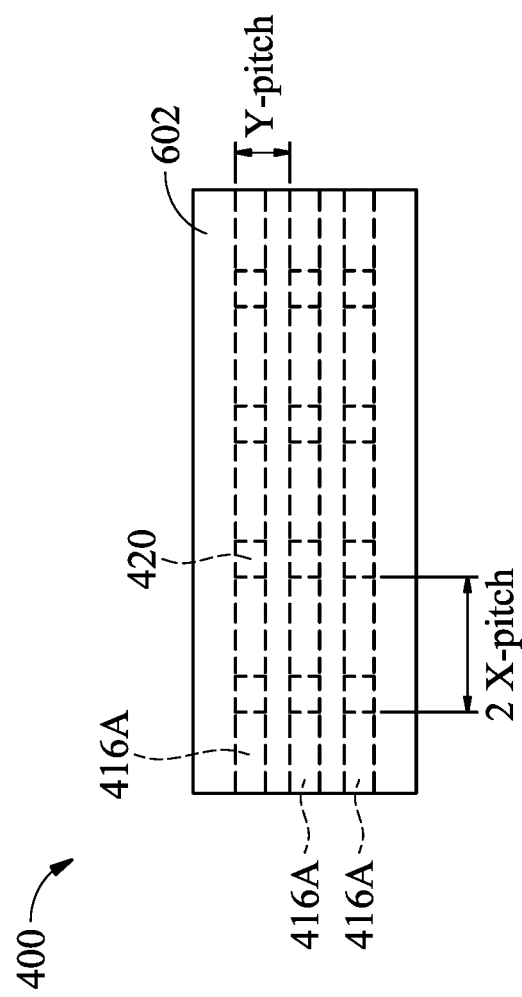

The method 300 then proceeds to block 310 where a capping layer is formed over the vias formed in block 308 discussed above. The capping layer may be a dielectric material layer. Examples of dielectric material include SiOC, AlOx, AlN, SiN, SiO$_2$ or combinations thereof. The capping layer may be deposited as a conformal layer. In an embodiment, the capping layer is deposited by PECVD or other suitable deposition method. Exemplary thicknesses of the capping layer are between 3~100 nm. The thickness of the capping layer may be determined by the number of memory cells disposed above the capping layer. For example, the more memory cells that are provided and/or the more layers of the memory device stack that extend vertically above the capping layer the greater the thickness desired for the capping layer. Referring to the example of FIGS. 6A and 6B, illustrated is a capping dielectric layer 602 formed over the substrate 402. The capping dielectric layer 602 interfaces each of the vias 420 and the adjacent ILD layer 418.

The method 300 then proceeds to block 312 where an array of memory cells is formed over the substrate. The array of memory cells may be formed over the peripheral circuit components, described above with reference to block 304, and over the MLI, vias and capping dielectric layer described above with reference to blocks 306, 208 and 310 respectively. In an embodiment, the array of memory cells includes cells having a vertically stacked flash memory device structures in which a plurality of flash memory cells (e.g. NOR flash memory cells) are formed vertically, that is, in a direction away from the top surface of the substrate.

Figure 7B:
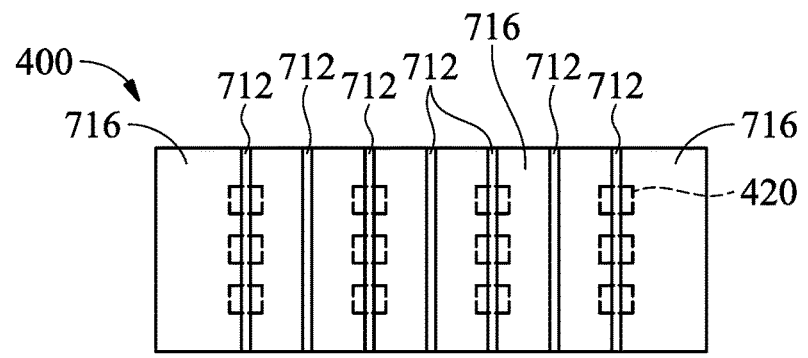
Figure 7A:
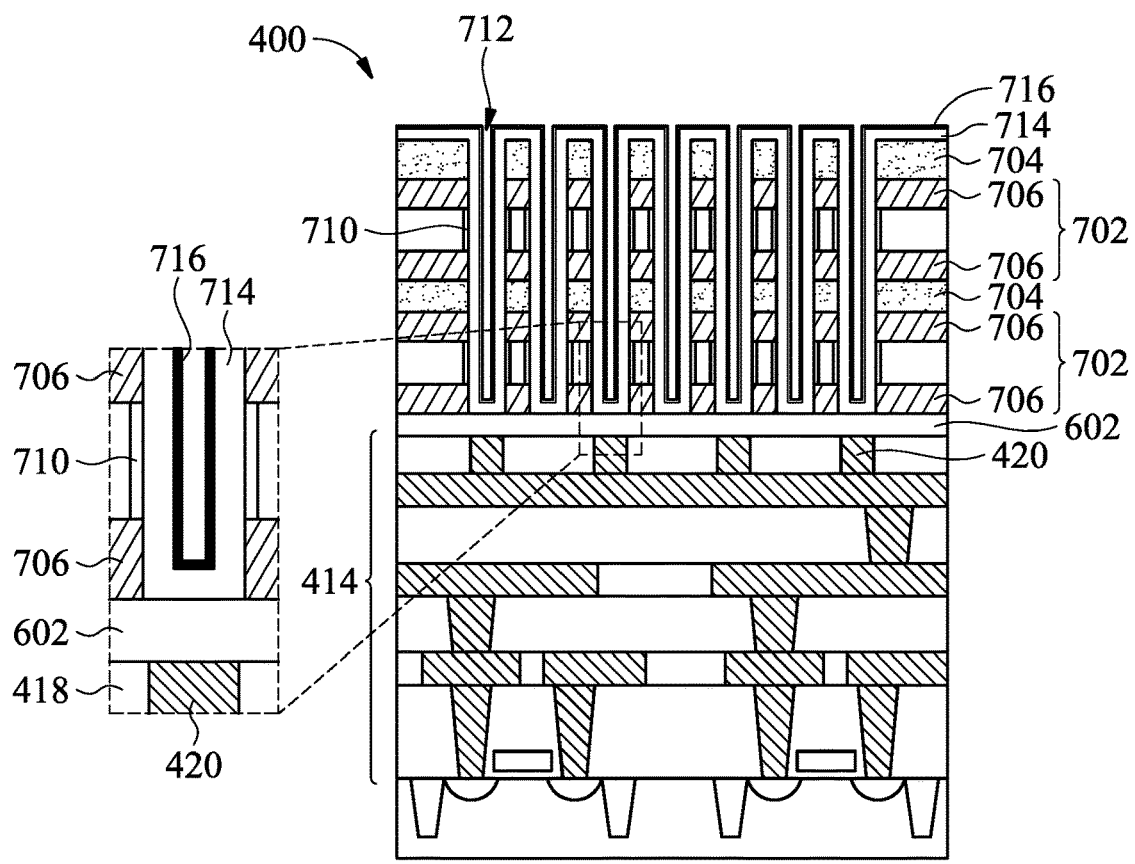

In some embodiments, block 312 includes forming a memory device stack used to form the memory cells. The memory device stack may be repeated any number of times such as 2, 4, 8, 16, 24, 32, or more dependent upon the desired array size. For exemplary purposes, the example of FIG. 7A illustrates 2 cycles of the memory device stack 702 interposed by a dielectric layer 704. In some embodiments, the memory device stack 702 includes layers suitable for forming source features, drain features, bit line features, source line features, channel regions, and/or other features of a memory cell. In the illustrated embodiment, the device 400 includes source/drain layers 706 for providing a respective one of a source region or a drain region of the memory cells. In an embodiment, the source/drain layers 706 are silicon. In some embodiments, the source/drain layers 706 are doped (e.g., doped silicon). In some embodiments, the source/drain layers 706 are undoped (e.g., undoped silicon). In an embodiment, a bottommost layer (adjacent the capping dielectric layer 602) is a source layer and the next above layer 706 is a drain layer. However, in other embodiments, the function of the layers 706 may be reversed. A dielectric layer (e.g., an oxide) 708 is formed interposing the source/drain layers 706. Again, while illustrated in the example of the device 400 are vertically stacked flash memory cells, the present disclosure may also be applied to other embodiments of memory cells.

In some embodiments, after formation of the memory device stacks 702, trenches 712 are etched in the memory device stacks. In an embodiment, the trenches 712 define a region for a gate structure to be formed. In an embodiment, a channel region 710 is formed for each cell adjacent the trenches 712. The channel region 710 may be polysilicon.

In some embodiments, a storage layer is then formed for the memory cells. Referring to the example of FIG. 7A, a storage layer 714 is deposited on the substrate 406. In an embodiment, the storage layer 714 is an ONO storage layer. The ONO storage layer may include an oxide-nitride-oxide configuration such as SiO2-Si3N4-SiO2. The storage layer 714 functions to trap charges where the current differences detected in the cell (e.g., drain current) provide the memory effect.

After formation of the storage layer 714, in some embodiments, a protection spacer 716 is formed on the device 400. The protection spacer 716 may be used to protect the storage layer 714 during subsequent processes (e.g., etching as discussed below in block 314). In some embodiments, the protection spacer 716 may be polysilicon. In a further embodiment, the protection spacer 716 may be doped or undoped polysilicon. In an embodiment, the protection spacer 716 is a similar material to that of the gate structure formed as discussed below. In some embodiments, the protection spacer 716 may be between approximately 1 nanometer and approximately 10 nanometers in thickness. In some embodiments, material for the protection spacer 716 is conformally deposited over the device 400 and then etched back such that it is within the trenches 712. The protection spacer 716 may be formed by dry etching.

The method 300 then proceeds to block 314 where an opening is provided to expose the vias, discussed above with respect to block 308. In an embodiment, the bottom of the trenches (e.g., trenches) are opened to, for some trenches, expose the vias. The opening to expose the vias may be performed using an etching process but without the need for a photolithography process or using a masking element during the etching process.

Figure 8A:
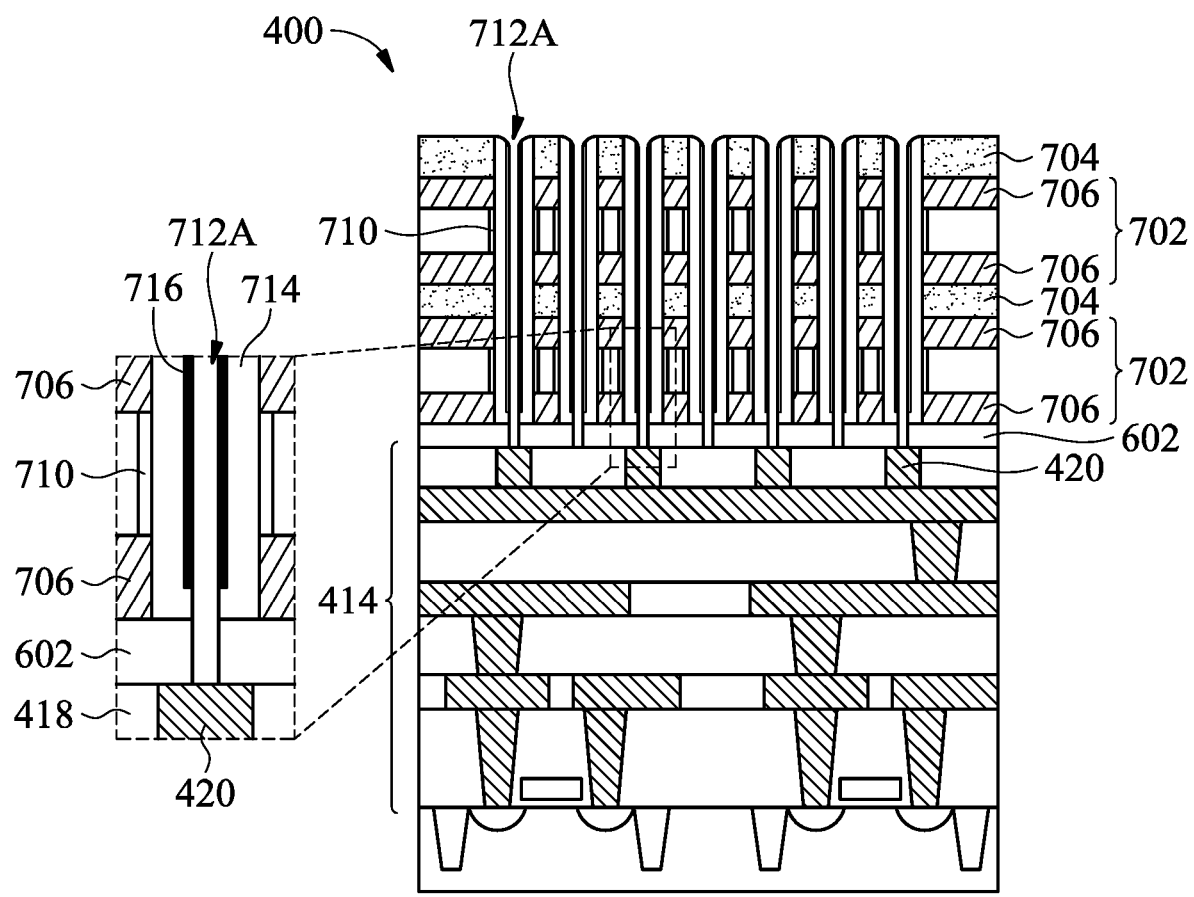

Referring to the example of FIG. 8A, a bottom of the trenches 712 is opened by an etching process. In particular, the storage layer 714 and the protection spacer 716 are removed from a bottom surface of the trenches 712 (see FIG. 7A) and the trench 712 bottom is etched open. This opening extends the depth of the trench 712 into and through the capping dielectric layer 602. The trench with an increased depth is denoted as 712A and is illustrated in FIG. 8A. It is noted that in some embodiments, the creation of the modified trench 712A (including the removal of the storage layer 714 and the protection spacer 716 from a bottom of trench 712) is performed without the need for a lithography step. In other words, the etching process does not use a masking element. The etching process applied may be anisotropic. In an embodiment, the etch has a non-selectivity between the materials to be etched. It is noted that the modified trenches 712A that are aligned with the vias 420 expose the aligned via 420. However, the modified trenches 712A that are not aligned with the vias 420 (e.g., as the vias 420 are at a pitch of 2× that of the trenches 712A) merely extend into the dielectric layer 418.

Figure 9A:
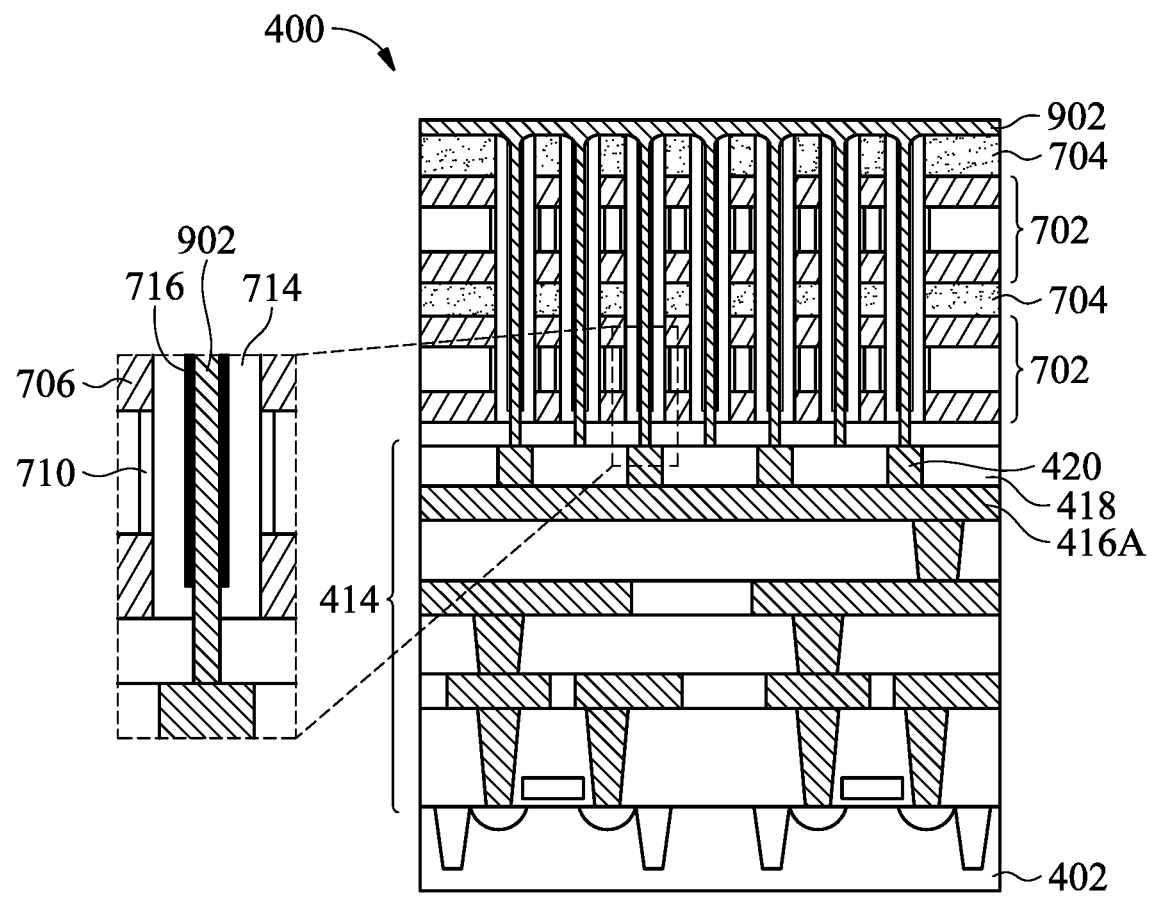

The method 300 then proceeds to block 316 where the gate structures of the memory cells are formed, which may include filling the openings exposing the vias, and the overlying trenches, with conductive material(s) to form the gate structures. In an embodiment, the conductive material forming the gate structures is polysilicon. Referring to the example of FIG. 9A, the modified trenches 712A have been filed with conductive material 902. In an embodiment, the conductive material 902 includes polysilicon. As illustrated in FIG. 9A, the conductive material 902 interfaces and provides an electrical connection to the vias 420.

Figure 10A:
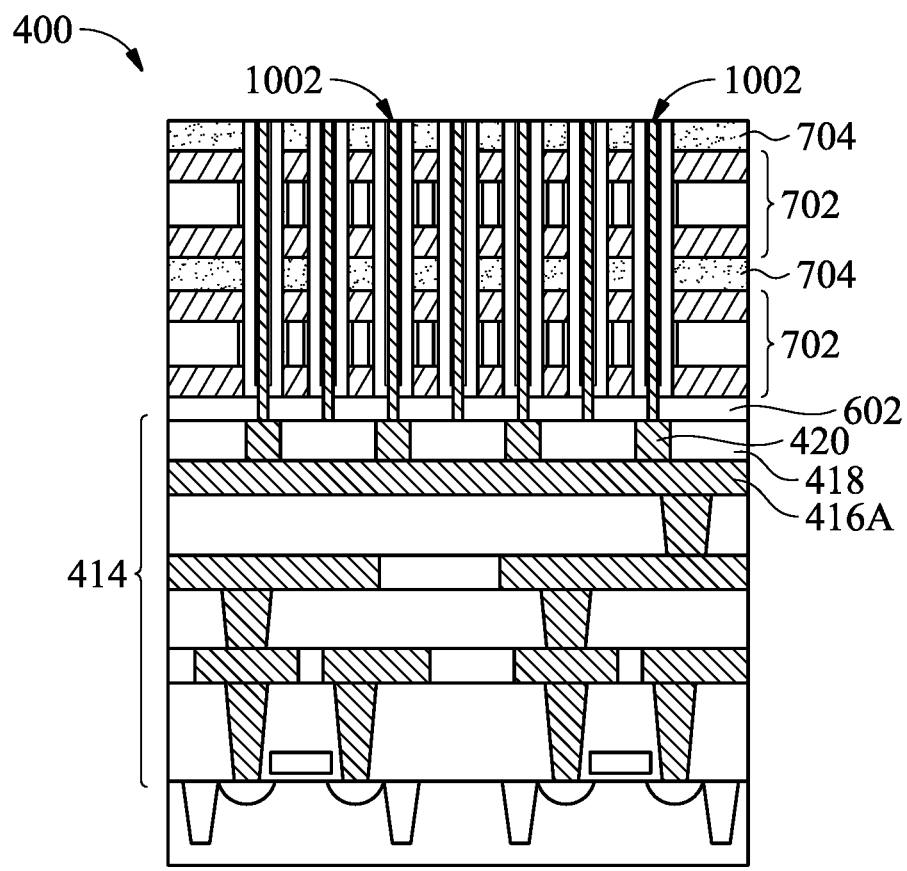

As illustrated in FIG. 10A, after deposition of the conductive material 902, the method may continue with a recessing of the conductive material 902 and/or planarization process of conductive material 902 to form the gate structures 1002 of the memory cells. The gate structures 1002 may provide control gate for the memory cells. The gate structure 1002 is formed adjacent the storage layer (ONO) 714.

In some embodiments, the method 300 and the step 316 includes performing a gate isolation process or cut process. In some embodiments, the gate structure (e.g., polysilicon) discussed above is isolated or cut into portions. In an embodiment, a masking element or elements (e.g., photoresist and/or hard mask) are formed to define where the gate structures are to be cut, separating gate lines of adjacent (e.g., in the y-direction) memory cells from one another.

Figure 11B:
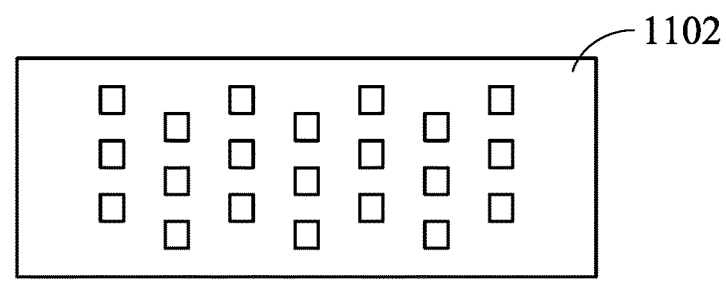
Figure 11A:
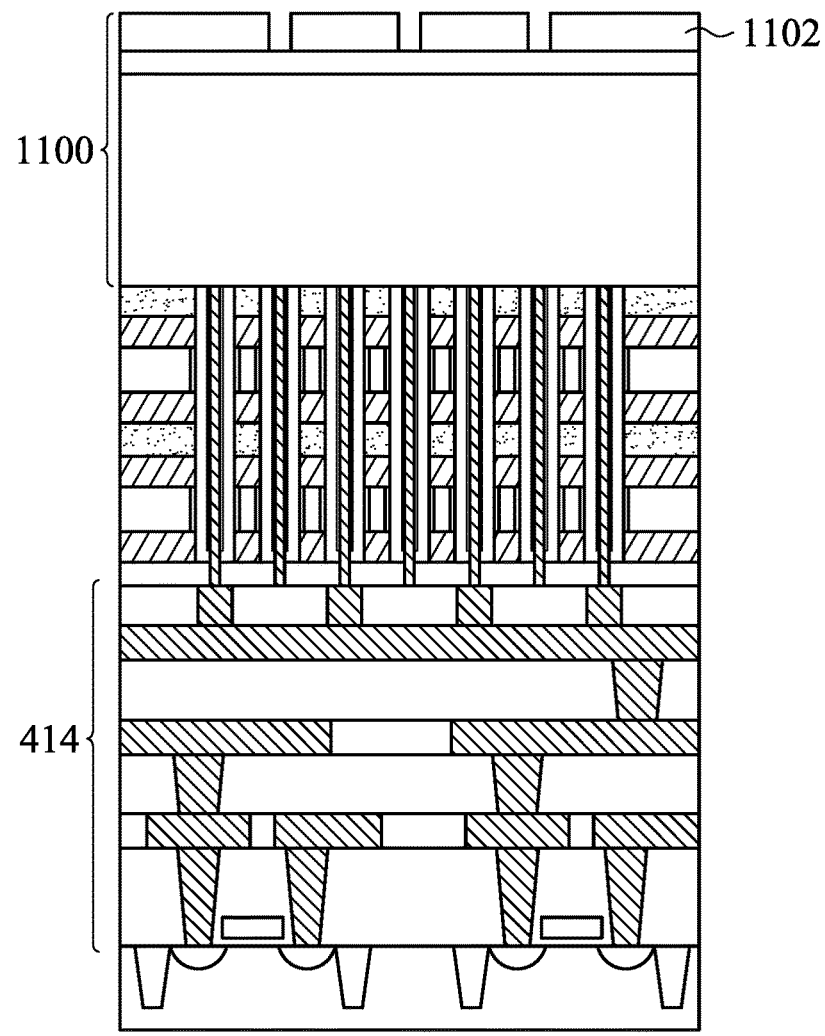

Referring to the example of FIGS. 11A and 11B, a masking element 1102 is formed. In an embodiment, the masking element 1102 is patterned photoresist material. In an embodiment, the openings provided in the masking element 1102 are arranged at a first pitch X and a second pitch Y. The first pitch X may be the bit line pitch, or the minimum pitch of the memory cells in the x-direction. The second pitch Y may be the word line pitch, or the minimum pitch of the memory cells in the y-direction. The formation of the masking element may include a plurality of layers, such as a tri-layer photoresist 1100, including the patterned photoresist material 1102, a middle layer (e.g., silicon containing spin-on coated material), and a bottom layer (e.g., organic spin-on coated material). After forming the masking element 1102, as illustrated in FIGS. 12A, 12B, and 12C, portions of the gate structures 1002 are removed underlying the openings of the masking element 1102. The portions of the gate structures 1002 may be removed by an etching process such as a dry etch process (e.g., plasma enhanced etch) or a wet etching process. Openings 1202 are formed in the gate structures 1002.

The block 316 may further include filling the openings formed by cutting the gate lines with insulating material to isolate the two portions of the gate structures. Referring to the example of FIGS. 13A, 13B and 13C, an insulating material 1302 is formed over the substrate and in the openings 1202. In an embodiment, the insulating material 1302 may be an oxide. The formation of insulating material 1302 may include a deposition process (e.g., CVD or other suitable process) followed by a planarization process.

The method 300 then proceeds to block 318 where an upper interconnect structure is formed over the memory cells. The formed upper interconnect structure may be substantially similar to the upper interconnect structure 210 described above with reference to the device 200 of FIG. 2. The upper interconnect structure may include an upper access line(s) for the memory cells and vias interconnecting a portion of the memory cells to this upper access line(s).

Figure 14A:
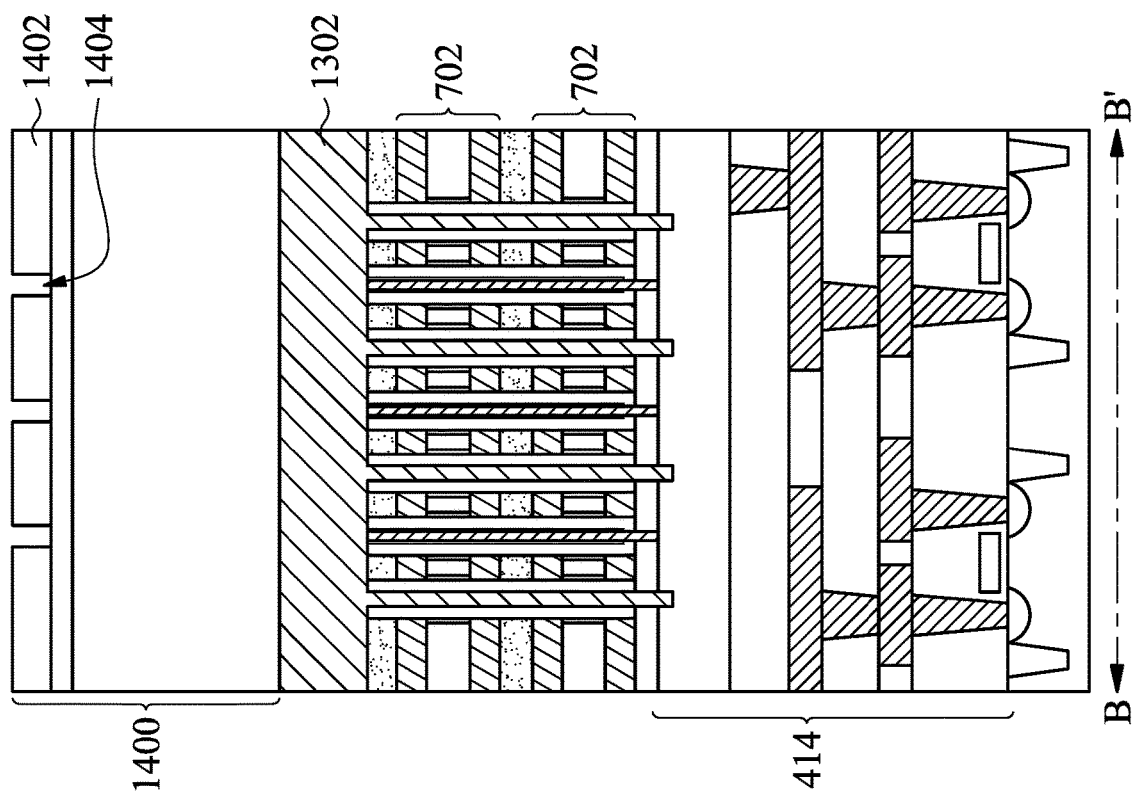
Figure 14B:
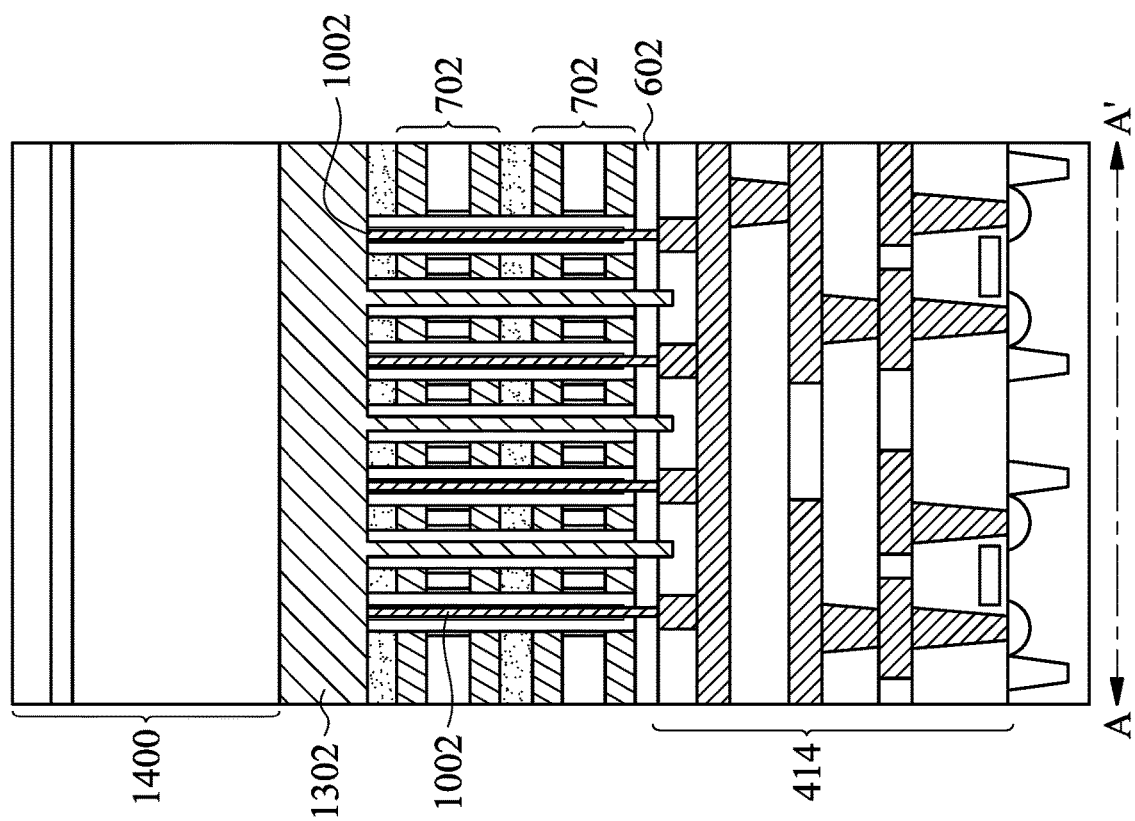
Figure 14C:
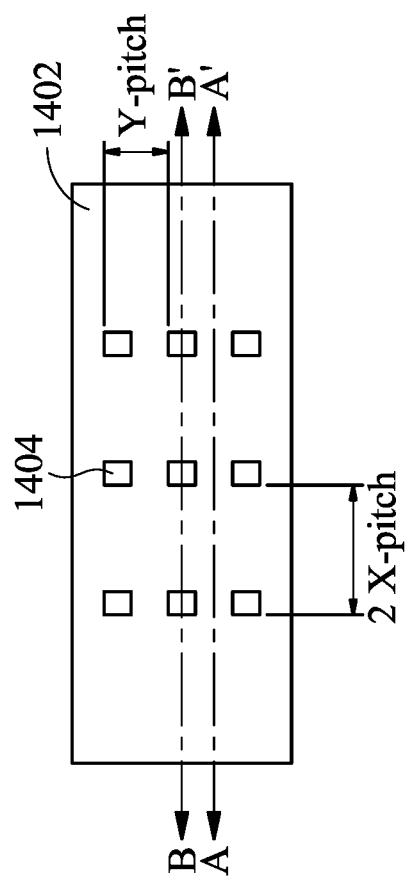
Figure 15A:
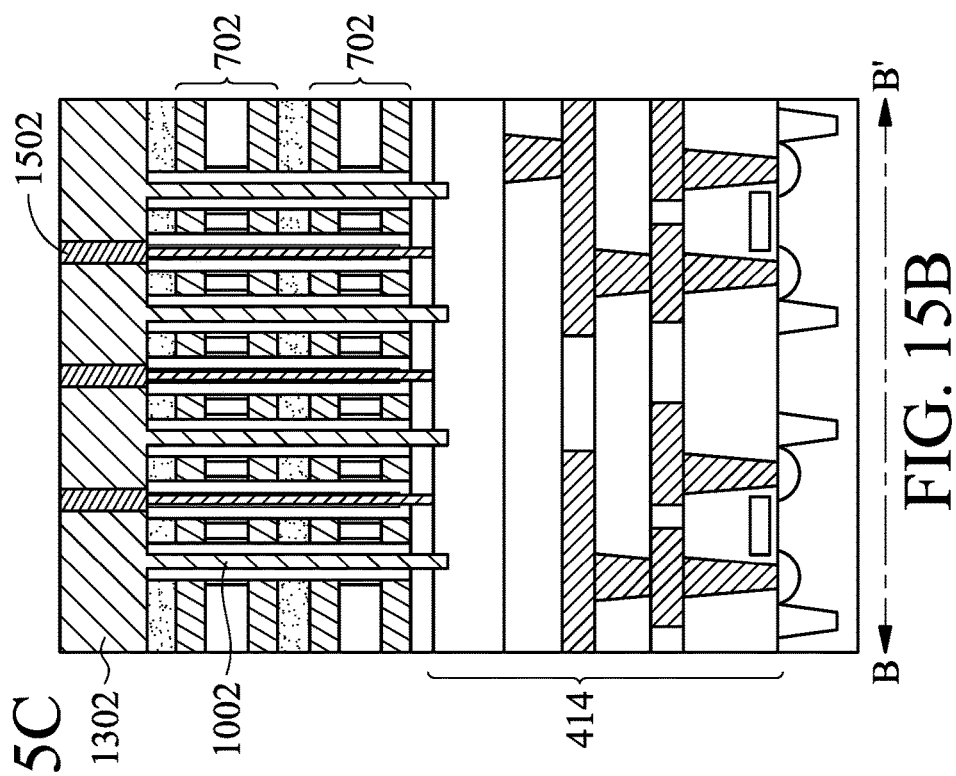
Figure 15B:
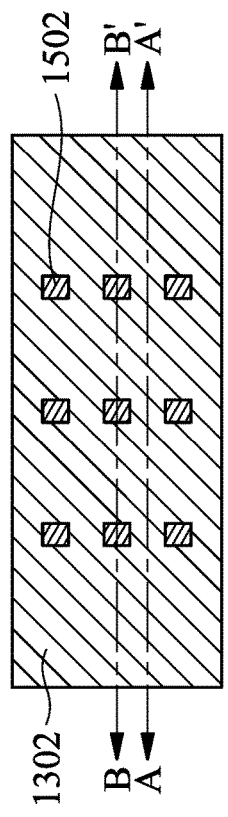
Figure 15C:
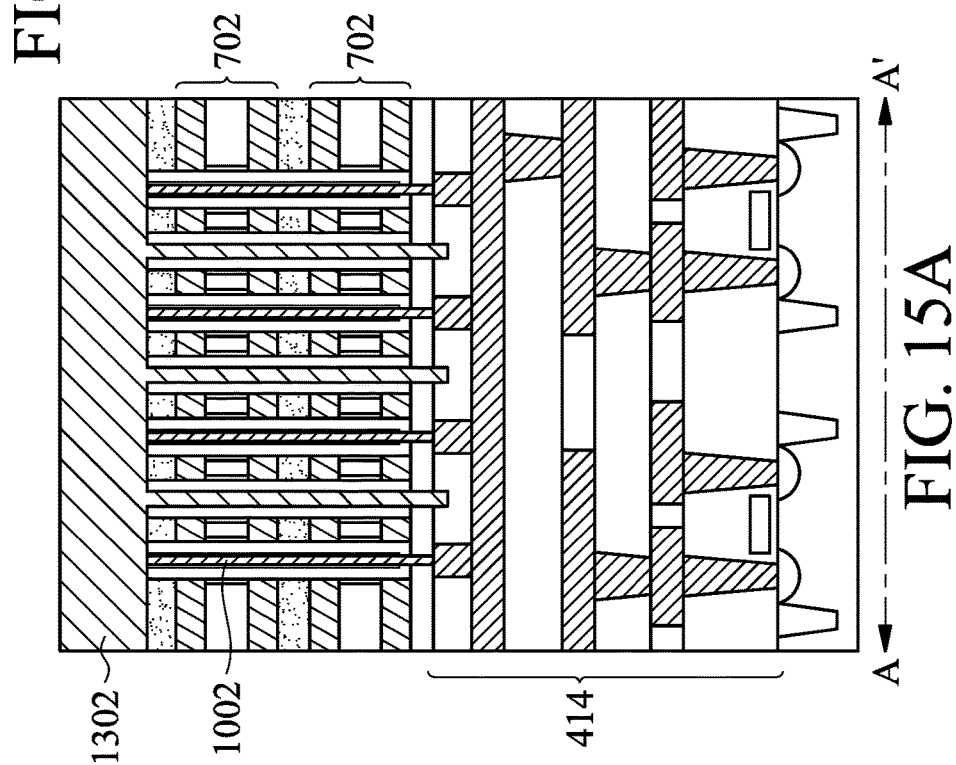

Referring to the example of FIGS. 14A, 14B, and 14C, a masking element 1402 is formed over the substrate and patterned to form openings 1404 to define a pattern for vias to provide an interconnection to the memory cells and, in particular, an interconnection to selective ones of the gate structures 1002. The masking element may include a multi-layer structure such as tri-layer photoresist 1400. As illustrated in FIG. 14C, the pitch of the openings 1404 may be approximately Y-pitch in the y-direction, and 2*X-pitch in the x-direction. The relaxation of the pitch in the x-direction to 2*X-pitch may be because the vias are only coupling to selective ones of the memory cells. In other words, the vias provide interconnection between an upper access line and a memory cell. Where a cell has been provided an interconnection to the lower access line (see 416A), the interconnection to the upper access line is not needed. Therefore, only a portion (e.g., half) of the gate structures require connection to the upper access line and thus, only a portion of the gate structures require interconnection to a via above the memory cell to be provided for a gate pick-up.

After forming the masking element 1402, block 318 includes etching the via openings and filling the vias with conductive material. Referring to the example of FIGS. 15A, 15B, and 15C, conductive vias 1502 are formed interfacing select gate structures 1002. For example, conductive vias 1502 interface every other memory cell and in particular, every other gate structure 1002 in the x-direction.

The block 318 of the method 300 then proceeds to form an access line (e.g., word line) above the memory cells and connected to the vias. Referring to the example of FIGS. 16A, 16B, and 16C, a metal layer 1602, which may provide access line(s) to the memory cells is formed. In an embodiment, the metal layer 1602 provides an access line that is a word line (WL). In a further embodiment, the access line 1602 is a word line provided to a first set of memory cells (gate structures 1002) and the access line 416A is a word line provided to a second set of memory cells. In another embodiment, the metal layer 1602 provides an access line that is a bit line (BL).

In an embodiment, every other gate structure (in the x-direction) is connected to the metal layer 1602 providing the access line, and the remaining gate structures are connected to metal layer 416A providing the access line. In an embodiment, the access lines provided by the metal layers 1602 and 416A provide the same functionality (e.g., both provide a word line). The metal layer 1602 and the vias 1502 may include conductive material such as tungsten (W), molybdenum (Mo), titanium (Ti), cobalt (Co), tantalum (Ta), nickel (Ni), polysilicon, aluminum (Al), copper (Cu), silicides, nitrides, and/or other suitable materials in one or more layers.

The method 300 may then continue to further fabrication steps including forming input/output features operable to access the device 400.

Thus, in some embodiments, it can be appreciated that the method 300 provides for a method and device that allow for the bottom access line and connection elements (e.g., access line and above disposed vias) to be formed prior to the memory cells. The formed bottom access line and connection elements may be covered with protective capping layer that can be subsequently removed in regions of interconnection with elements of the memory cells (e.g., gate structures). The methods provide in some embodiments, the removal of the capping layer and exposure to the bottom access line and connection elements without requiring a photolithography process or difficult etching processes to later form the interconnection elements. After forming the memory cells, an upper access line is provided to a portion of the memory cells (e.g., where were not provided interconnection to the lower access line). As a result, in some embodiments, the memory cell size can be decreased. In some embodiments, the methods may provide for an improved production yield (e.g., eliminating a photolithography step as discussed above). Further, some embodiments of the method step provide for protection of the storage layer of the memory cells to be protected from damage.

In one of the broader embodiments discussed herein, a method is provided to fabricate a semiconductor device. The method includes forming a transistor of a peripheral circuit on a substrate and forming a first interconnect structure over the transistor. The first interconnect structure includes a first access line. The method further includes forming a via extending above the first access line. After forming the via, the method includes forming a plurality of memory cell structures over the interconnect structure and the via. A second interconnect structure is formed over the memory cell structure. The second interconnect structure includes a second access line. The first access line is coupled to a first memory cell of the plurality of memory cell structures and second access line is coupled to a second memory cell of the plurality of memory cell structures.

In a further embodiment, the method includes depositing a dielectric protection layer over the via prior to forming the plurality of memory cell structures. In an embodiment, the first access line is a word line and the second access line is a word line. In an embodiment, the first access line is a bit line and the second access line is a bit line. In an embodiment, the method further includes forming the plurality of memory cell structures by: forming a memory device stack including a source layer and a drain layer; etching a plurality of openings in the memory device stack; and forming a gate structure in each of the plurality of openings. In a further embodiment, the etching the plurality of openings includes etching a first opening to expose the via and etching a second opening adjacent the first opening. The second opening exposes a dielectric material adjacent the via. In an embodiment, forming the gate structure includes depositing polysilicon in the first opening, the polysilicon interfacing the via. In an embodiment, the method may further comprise forming a spacer layer on sidewalls of each of the plurality of openings prior to forming the gate structure in each of the plurality of openings and/or forming ONO storage layer on the sidewalls of each of the plurality of openings prior to forming the spacer layer.

In another of the broader embodiments, a method of fabricating a semiconductor device is provided that includes forming devices of a peripheral circuit on a substrate and forming a first metal layer above the devices of the peripheral circuit. A plurality of vias are formed at a first pitch in a first direction and a second pitch in a second direction, each of the plurality of vias extending above the first metal layer. A capping layer is deposited over the plurality of vias. A plurality of memory cells is formed above the capping layer. The plurality of memory cells have gate structures formed at a third pitch in the first direction. The third pitch is approximately half the first pitch. The method then includes connecting a first gate structure of the plurality of memory cells to a first via of the plurality of vias.

In a further embodiment, the method includes connecting a second gate structure of the plurality of memory cells to a second metal layer disposed above the plurality of memory cells. In an embodiment, the first gate structure and the second gate structure are associated with adjacent memory cells of the plurality of memory cells. In an embodiment, the capping layer is SiOC, AlOx, AlN, SiN or SiO2. In an embodiment, the plurality of vias are formed of tungsten. In an embodiment the method further includes forming the plurality of memory cells above the capping layer includes forming a stack of layers providing source/drain features interposed by dielectric layers. The gate structures may extend through the stack of layers. In an embodiment, a storage layer interposing each of the gate structures and the stack of layers.

In another of the broader embodiments a semiconductor memory device includes peripheral circuitry formed over the substrate, a memory cell array formed over the peripheral circuitry, and a conductive via extending above the first word line, the first memory cell connected to the first word line by way of the conductive via. A first memory cell of the memory cell array is connected to a first word line between the peripheral circuitry and the memory cell array and a second memory cell of the memory cell array is connected to a second word line disposed above the memory cell array.

In a further embodiment, a gate structure of the first memory cell interfaces the conductive via. In an embodiment, the gate structure extends through a dielectric capping layer disposed above the conductive via and below a source/drain of the first memory cell. In an embodiment, the first memory cell and the second memory cell are flash memory cells.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method to fabricate a semiconductor device, comprising:
    forming a transistor of a peripheral circuit on a substrate;
    forming a first interconnect structure over the transistor, wherein the first interconnect structure includes a first access line;
    forming a via extending above the first access line;
    after forming the via, forming a plurality of memory cell structures over the first interconnect structure and the via, wherein the forming the plurality of memory cell structures include:
    forming a memory device stack;
    etching a plurality of openings in the memory device stack, wherein a first opening of the plurality of openings exposes a top surface of the via and a second opening of the plurality of openings exposes a dielectric material adjacent the via; and
    forming a first memory cell structure in the first opening and forming a second memory cell structure in the second opening; and
    forming a second interconnect structure over the plurality of memory cell structures, wherein the second interconnect structure includes a second access line, wherein the first access line is coupled to the first memory cell structure of the plurality of memory cell structures and second access line is coupled to the second memory cell structure of the plurality of memory cell structures.

2. The method of claim 1, further comprising:
    depositing a dielectric protection layer over the via prior to forming the plurality of memory cell structures.

3. The method of claim 1, wherein the first access line is a word line and the second access line is a word line.

4. The method of claim 1, wherein the first access line is a bit line and the second access line is a bit line.

5. The method of claim 1, wherein the forming the plurality of memory cell structures includes:
    forming the memory device stack including a source layer and a drain layer;
    and
    forming a gate structure in each of the first opening and the second opening.

6. The method of claim 1, wherein the second interconnect structure includes another via, a top of the second memory cell structure interfacing the another via and a top of the first memory cell structure interfacing a dielectric material adjacent the another via.

7. The method of claim 6, wherein the forming the gate structure includes depositing polysilicon in the first opening, the polysilicon interfacing the via.

8. The method of claim 5, further comprising:
    forming a spacer layer on sidewalls of each of the plurality of openings prior to forming the gate structure in each of the plurality of openings.

9. The method of claim 8, further comprising:
    forming an ONO storage layer on the sidewalls of each of the plurality of openings prior to forming the spacer layer.

10. A method of fabricating a semiconductor device, the method comprising:
    forming devices of a peripheral circuit on a substrate;
    forming a first metal layer above the devices of the peripheral circuit;
    forming a plurality of vias at a first pitch in a first direction and a second pitch in a second direction, each of the plurality of vias extending above the first metal layer;
    depositing a capping layer over the plurality of vias;
    forming a plurality of memory cells above the capping layer, wherein the plurality of memory cells have gate structures formed at a third pitch in the first direction, wherein the third pitch is approximately half the first pitch; and
    connecting a first gate structure of the plurality of memory cells to a first via of the plurality of vias.

11. The method of claim 10, further comprising:
    connecting a second gate structure of the plurality of memory cells to a second metal layer disposed above the plurality of memory cells.

12. The method of claim 11, wherein the first gate structure and the second gate structure are associated with adjacent memory cells of the plurality of memory cells.

13. The method of claim 10, wherein the capping layer is SiOC, AlOx, AN, SiN or SiO2.

14. The method of claim 10, wherein the plurality of vias are formed of tungsten.

15. The method of claim 10, wherein the forming the plurality of memory cells above the capping layer includes forming a stack of layers providing source/drain features interposed by dielectric layers, wherein the gate structures extend through the stack of layers.

16. The method of claim 15, a storage layer interposing each of the gate structures and the stack of layers.

17. A method to fabricate a semiconductor device, comprising:
    forming a transistor of a peripheral circuit on a substrate;
    forming a first interconnect structure over the transistor, wherein the first interconnect structure includes a first conductive via and a second conductive via;
    after forming the first interconnect structure, etching a plurality of openings above the first interconnect structure wherein a first opening of the plurality of openings extends to the first conductive via and a second opening of the plurality of openings extends to the second conductive via and a third opening interposes the first opening and the second opening;
    forming a memory cell structurein each of the plurality of openings over the first interconnect structure, wherein a first memory cell structure is formed in the first opening, a second memory cell structure is formed in the second opening, and a third memory cell structure is formed in the third opening; and
    forming a second interconnect structure over the memory cell structure, wherein the third memory cell structure interfaces the second interconnect structure;
    connecting the first memory cell structure and the second memory cell structure to a first conductive line of the first interconnect structure through the first and second conductive vias respectively and connecting the third memory cell structure to a second conductive line of the second interconnect structure.

18. The method of claim 17, wherein the forming the first interconnect structure includes forming a dielectric region between the first conductive via and the second conductive via, wherein the third memory cell structure interfaces the dielectric region.

19. The method of claim 18, wherein the forming the first and second memory cell structures includes forming a gate structure interfacing the first conductive via and the second conductive via respectively.

20. The method of claim 17, wherein the third memory cell structure in offset from the first memory cell structure and the second memory cell structure in a first direction and a second direction, wherein the first direction is orthogonal to the second direction and each of the first and second directions are parallel a top surface of the substrate.

* * * * *